US006177237B1

(12) United States Patent
Guida et al.

(10) Patent No.: US 6,177,237 B1
(45) Date of Patent: Jan. 23, 2001

(54) HIGH RESOLUTION ANTI-SCATTER X-RAY GRID AND LASER FABRICATION METHOD

(75) Inventors: Renato Guida, Wynantskill; James Wilson Rose, Guilderland; Kenneth Paul Zarnoch, Scotia, all of NY (US); Gary John Thumann, Oconomowoc, WI (US)

(73) Assignee: General Electric Company, Schenectady, NY (US)

( * ) Notice: Under 35 U.S.C. 154(b), the term of this patent shall be extended for 0 days.

(21) Appl. No.: 09/105,788

(22) Filed: Jun. 26, 1998

(51) Int. Cl.[7] .......... G03F 7/00

(52) U.S. Cl. .......... 430/320; 430/396; 430/945; 216/65

(58) Field of Search .......... 430/394, 396, 430/945, 311, 320, 397; 216/65; 378/154

(56) References Cited

U.S. PATENT DOCUMENTS

| | | | | |
|---|---|---|---|---|
| 4,929,256 | * | 5/1990 | Shepherd | 51/293 |
| 5,198,680 | * | 3/1993 | Kurakake | 378/147 |
| 5,231,655 | * | 7/1993 | Wei et al. | 378/147 |
| 5,557,650 | | 9/1996 | Guida et al. | 378/154 |
| 5,581,592 | | 12/1996 | Zarnoch et al. | 378/154 |
| 5,666,722 | * | 9/1997 | Tamm et al. | 29/847 |

OTHER PUBLICATIONS

"Phase Mask Machining for High Throughput Via Formation" by Ah Smith, Litel Instruments, PP 1–6, Apr. 1993.

"Cylindrical Lens Arrays Homogenize Excimer Beam" by B. Smoother, Laser Focus World, Nov. 1991, PP 39.

"Application of Excimer Lasers in Electronic Packaging and Manufacturing" by Lambda Physik, May 1996, Lambda Physik Industrial Report, Publication No. 10, pp. 1–8.

* cited by examiner

*Primary Examiner*—Kathleen Duda

(74) *Attorney, Agent, or Firm*—Ann M. Agosti; Jill M. Breedlove

(57) ABSTRACT

A method for fabricating a substantially transparent polymer substrate for an anti-scatter x-ray grid for medical diagnostic radiography includes positioning a phase mask between the substrate and a high power laser; providing a laser beam from the laser; conditioning the laser beam; ablating a first portion the substrate through the phase mask with the conditioned laser beam; and moving the substrate; and ablating a second portion of the substrate through the phase mask with the conditioned laser beam.

8 Claims, 4 Drawing Sheets

HIGH RESOLUTION ANTI-SCATTER X-RAY GRID AND LASER FABRICATION METHOD

BACKGROUND OF THE INVENTION

The present invention relates generally to the field of diagnostic radiography and, more particularly, to an anti-scatter grid capable of yielding high resolution, high contrast radiographic images and a laser fabrication method.

During medical diagnostic radiography processes, x-radiation impinges upon a patient. Some of the x-radiation becomes absorbed by the patient's body, and the remainder of the x-radiation penetrates through the body. The differential absorption of the x-radiation permits the formation of a radiographic image on an image receptor such as a photosensitive film, an image intensifier, or a digital receptor.

Of the x-rays that pass through the body, primary radiation travels unimpeded and directly along the path from which the x-rays were originally emitted from the source. Scattered radiation is that which passes through the body, is scattered by the body elements, and thus travels at an angle from the original path. Both primary and scattered radiation will contribute to an image, but scattered radiation, by nature of its trajectory, reduces image contrast (sharpness) of the projected image. In conventional posterior/anterior chest x-ray examinations, for example, about sixty percent of the radiation that penetrates through the body can be in the form of scattered radiation and thus impart a significant loss of image contrast. Therefore, it is desirable to filter out as much of the scattered radiation as possible.

One embodiment for filtering scattered radiation includes an anti-scatter grid which is interposed between the body and the image receptor. Scattered radiation impinges upon absorbent (opaque) material in the grid and becomes absorbed. Also absorbed by the absorbing material, however, is a portion of the primary radiation. The radiographic imaging arrangement of this embodiment provides higher contrast radiographs by virtue of the significant reduction of the scattered radiation, but necessitates an increase in radiation dosage to the patient in order to properly expose the photographic element. The increased radiation requirement results in part because the scattered radiation no longer constitutes part of the imaging x-ray beam, and in part because as much as thirty percent or more of the primary beam impinges upon the absorbing material in the grid and itself becomes filtered out (i.e. absorbed).

The increased radiation required for the exposure can be a factor of five (5) or more, i.e., the patient can receive five times the x-radiation dose when the grid is used as a part of the radiographic system. Because high doses of x-radiation pose a health hazard to the exposed individual, there has been a continual need to reduce the amount of x-radiation a patient receives during the course of a radiographic examination.

Many conventional grids use thin lead strips as the x-ray absorber and either aluminum or fiber composite strips as transparent interspace material. Conventional manufacturing processes consist of laminating individual strips of the absorber material and non-absorber interspace material by gluing together alternate layers of the strips until thousands of such alternating layers comprise a stack. Furthermore, to fabricate a focused grid, the individual layers must be placed in a precise manner so as to position them at a slight angle to each other such that each layer is fixedly focused to a convergent line: the x-ray source. After the composite of strips is assembled into a stack, it must them be cut and carefully machined along its major faces to the required grid thickness that may be as thin as 0.5 millimeters, the fragile composite then being, for example, 40 centimeters by 40 centimeters by 0.5 millimeters in dimension and very difficult to handle. The composite then must further be laminated with sufficiently strong materials so as to reinforce the fragile grid assembly and provide enough mechanical strength for use in the field. Accidental banging, bending, or dropping of such grids can cause internal damage, i.e., delamination of the layers which cannot be repaired, rendering the grid completely useless.

Due to the nature of the stacking process, grids fabricated from a conventional stack of layers of x-ray absorbers and transparent interspace materials are limited to linear geometries. Furthermore, even if the absorbers and the interspace materials are kept within specification ranges, the process often creates a cumulative line positioning error consisting of the sum of the layers' thickness variations and the thickness variations of adhesives between the layers.

A significant parameter in the grid design is the grid ratio, which is defined as the ratio between the height of the x-ray absorbing strips and the distance between them. The ratios typically range from 4:1 to 16:1. Because a value of about 0.050 millimeter lead thickness is a practical limit imposed by current manufacturing limitations, i.e., it being extremely difficult to handle strips at this thickness or thinner, a grid with a ratio of 4:1 with a line rate of 60 lines per centimeter demands that the interspace material be 0.12 millimeters in width and results in a grid that is only 0.028 millimeters thick. Because of the manufacturing limitations, the lead strips in these grids are generally too wide and, consequently, yield a large cross-sectional area that undesirably absorbs as much as thirty percent or more of the primary radiation. Furthermore, the thick strips result in an undesirable shadow-image cast onto the image receptor. To obliterate the shadows, it becomes necessary to provide a mechanical means for moving the grid during the exposure period. This motion of the grid causes lateral decentering and can consequently result in absorption of an additional twenty percent of the primary radiation. Thus the use of wide absorber strips requires a significant increase in patient dosage to compensate this drawback.

A present goal of the electronic imaging industry is to replace film-based imaging systems. Image detectors such as charge coupled device (CCD) detectors and flat panel amorphous silicon (α-Si) detectors are likely to be used in the future as a substitute for films and electronic tubes. Such image detectors include large arrays of elements with pixel pitches of 200 micrometers or less. Conventional x-ray grids cannot be optimized with these arrays because they are fabricated with straight lines and generally cannot match the array pitch. If absorbing material of the x-ray grids overlaps the active areas of the image detectors, the efficiency of the image detectors is reduced and Moiré patterns can be generated.

Commonly assigned U.S. Pat. No. 5,557,650, issued Sep. 17, 1996, discloses a method for fabricating an anti-scatter x-ray grid which includes providing a substrate having channels therein and material that is substantially non-absorbent of x-radiation, and filling the channels with absorbing material that is substantially absorbent of x-radiation. In one embodiment, the substrate is provided by sawing a plastic substrate with a thin circular blade and the channels are filled by melting absorbing material and flowing the melted absorbing material into the channels. These grids have increased resolution over prior lamination techniques.

SUMMARY OF THE INVENTION

There is a particular need for a fabrication process which permits the forming of diverse patterns, shapes, and sizes of absorbing material in an anti-scatter x-ray grid.

Briefly, according to one embodiment of the present invention, a method for fabricating a substantially transparent polymer substrate for an anti-scatter x-ray grid for medical diagnostic radiography includes positioning a phase mask between the substrate and a high power laser; providing a laser beam from the laser; conditioning the laser beam; ablating a first portion of the substrate through the phase mask with the conditioned laser beam; and moving the substrate; and ablating a second portion of the substrate through the phase mask with the conditioned laser beam.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
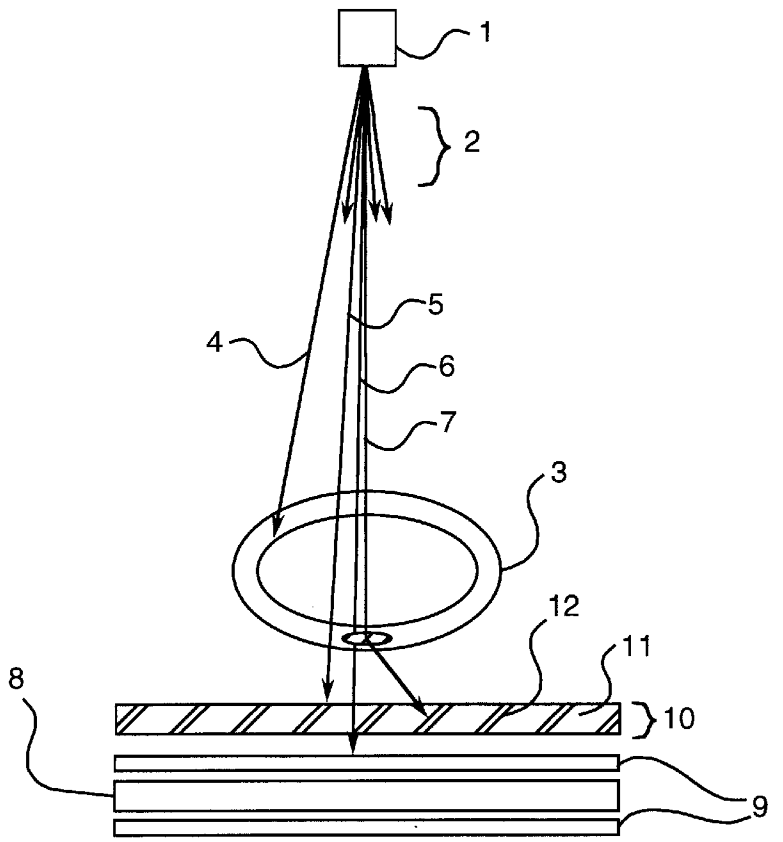
FIG. 1 (PRIOR ART)
FIG. 1 is a sectional side view of a conventional radiographic imaging arrangement.

FIG. 1 is a sectional side view of a conventional radiographic imaging arrangement. A tube 1 generates and emits x-radiation 2 which travels toward a body 3. Some of the x-radiation 4 is absorbed by the body while some of the radiation penetrates and travels along paths 5 and 6 as primary radiation, and other radiation is deflected and travels along path 7 as scattered radiation.

Radiation from paths 5, 6, and 7 travels toward an image receptor such as photosensitive film 8 where it will become absorbed by intensifying screens 9 which are coated with a photosensitive material that fluoresces at a wavelength of visible light and thus exposes photosensitive film 8 (the radiograph) with the latent image.

When an anti-scatter grid 10 is interposed between body 3 and photosensitive film 8, radiation paths 5, 6, and 7 travel toward the anti-scatter grid 10 before film 8. Radiation path 6 travels through translucent material 11 of the grid, whereas both radiation paths 5 and 7 impinge upon absorbing material 12 and become absorbed. The absorption of radiation path 7 constitutes the elimination of the scattered radiation. The absorption of radiation path 5 constitutes the elimination of part of the primary radiation. Radiation path 6, the remainder of the primary radiation, travels toward the photosensitive film 8 and becomes absorbed by the intensifying photosensitive screens 9 which expose photosensitive film 8 with the latent image.

Figure 2:
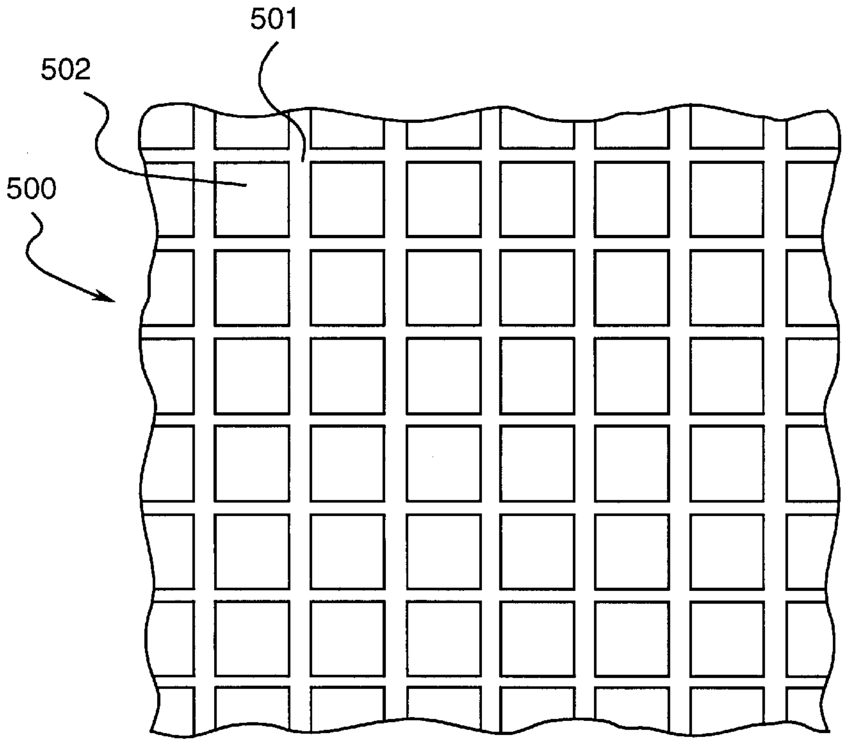
FIG. 2 is a magnified top view of a portion of an image detector.

FIG. 2 is a magnified top view of a portion of an image detector 500 which may comprise a CCD detector or an α-Si detector, for example. Operation of the anti-scatter grid in an image detector embodiment will be different in that no photosensitive film will be used. The surface of the detector includes a grid of charge collecting regions 502. It is important that the x-radiation that passes through the anti-scatter grid is substantially aligned with a charge collecting region and not an interspace 501 between charge collecting regions.

Figure 3:
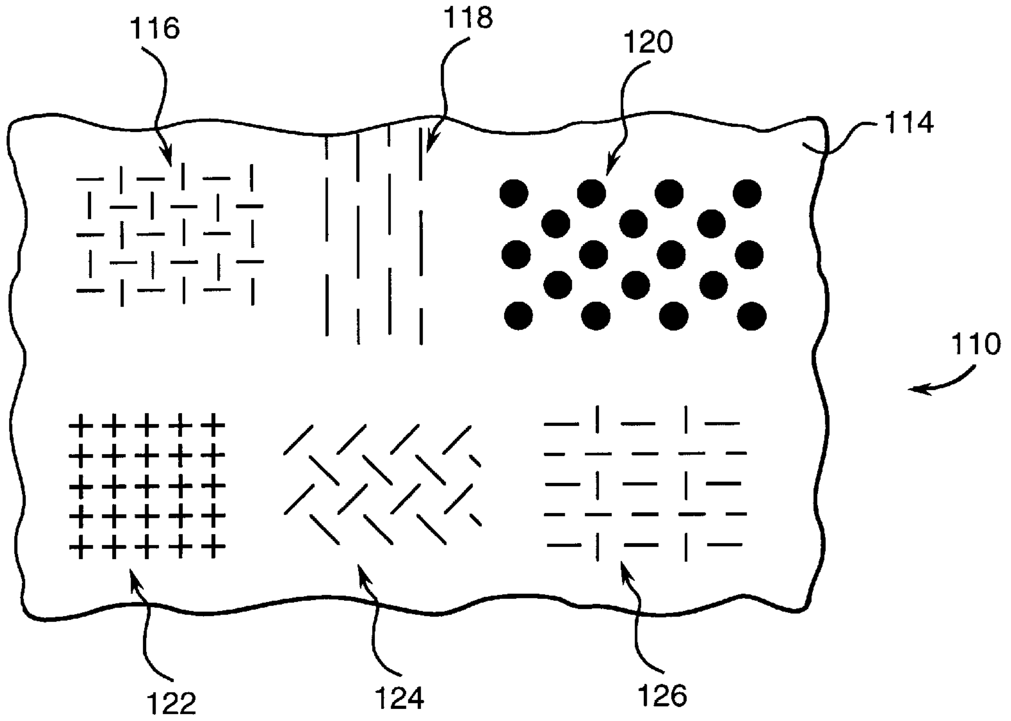
FIG. 3 is a top view of a number of different x-ray absorber patterns which can be formed using the present invention.

FIG. 3 is a top view of a number of different complex patterns 116, 118, 120, 122, 124, and 126 of absorbent material which can be formed in a substrate 114 for fabricating an anti-scatter grid 110 using the present invention. The word "complex" is meant to include patterns other than conventional parallel, non-broken, linear patterns.

In the present invention, a laser is used to oblate portions of a substantially transparent polymer substrate. Substantially absorbent material such as a lead bismuth, for example, is then provided in the openings of the substrate resulting from the laser ablation. The words "substantially transparent" means that the substrate thickness and material are sufficient to prevent substantial attenuation of the applied X-ray energy such that at least 85% (and preferably at least 90%) of the X-ray energy will pass through the substrate. The words "substantially absorbent" are meant to refer to materials and thickness which absorb at least 85% (and preferably at least 90%) of the applied energy. Whether a material is classified transparent or absorbent will depend on the type of applied X-ray energy because higher energy will pass more readily than lower energy.

From modeling experiments using commercially available software modeling packages, it has been determined that anti-scatter grid performance experiences variations as the patterns are varied. As discussed above, when electronic detectors are used, these include an array of a large number of pixels which have pixel size and pitch which should be matched to the grid patterns to avoid Moiré patterns and to maximize the exposure in the active area.

Figure 4:
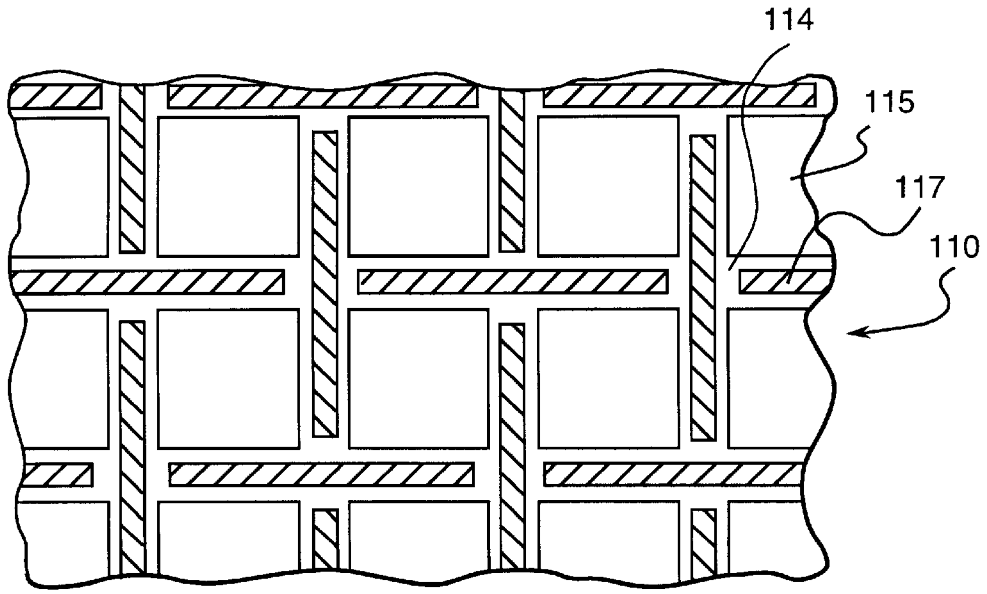
FIG. 4 is a top view of an x-ray absorber pattern further showing the removal of additional areas of the substrate.

FIG. 4 is a top view of an absorber pattern further showing the removal of additional areas 115 of substrate 114. It is most efficient to remove areas 115 after the filling of the absorbent material 117. This embodiment results in a more flexible x-ray grid. Further, the amount of radiation that can pass through air is greater than that which can base through the substantially transparent substrate.

Figure 5:
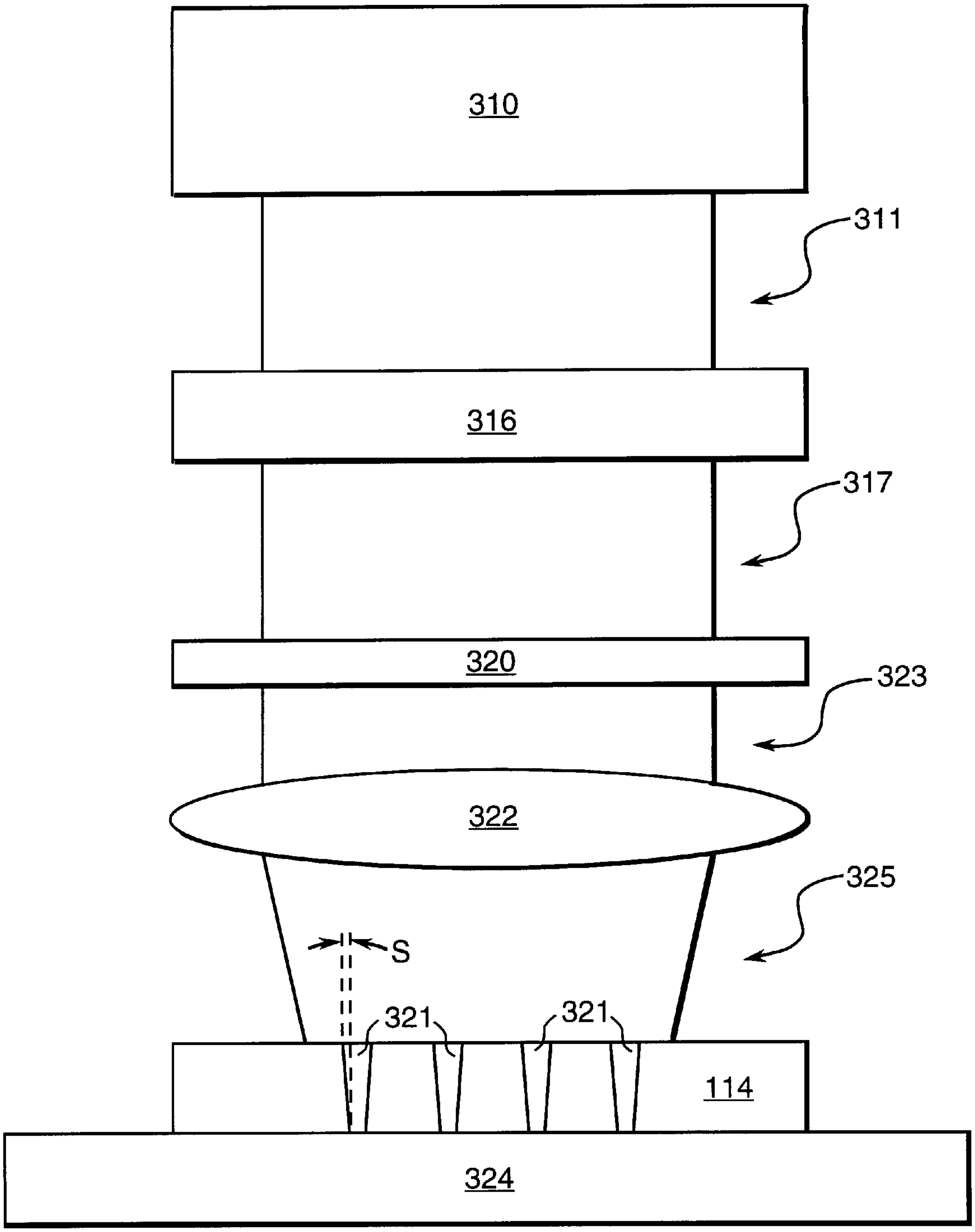
FIG. 5 is a block diagram of a laser fabrication assembly of the present invention.

FIG. 5 is a block diagram of a laser fabrication assembly of the present invention including a laser 310, a beam homogenizer 316, a phase mask 320, an optional objective lens 322, and a table 324.

Laser 310, which provides a raw beam 311 of high energy, preferably comprises a high power laser such as, for example, a Lambda 4000 laser available from Lamba Physics. The laser should be capable of providing at least 200 watts and at least 600 milli joules per pulse and should have an appropriate wavelength to match the ablation characteristics of the non-absorbing substrate material 114. In one embodiment substrate material 114 comprises a polymer and the laser wavelength is 248 or 308 nanometers. Preferable types of polymers include, for example, polyetherimides, polyimides, and polycarbonates. In one embodiment the thickness of the substrate ranges from about 0.3 millimeters to about 1.5 millimeters.

Beam homogenizer 316 receives the laser beam, corrects its asymmetric beam divergence and creates a beam 317 with a very uniform fluence across the entire illumination.

The uniform fluence is important to optimize the utilization of the entire beam energy delivered by the laser.

Phase mask 320 is used to create the desired pattern of openings 321 on the substrate and to enable the system to use the highest possible percentage of the incoming beam. Although light beams 323 and 325 are shown as solid in FIG. 5, they include a number of individual beams.

Figure 6:
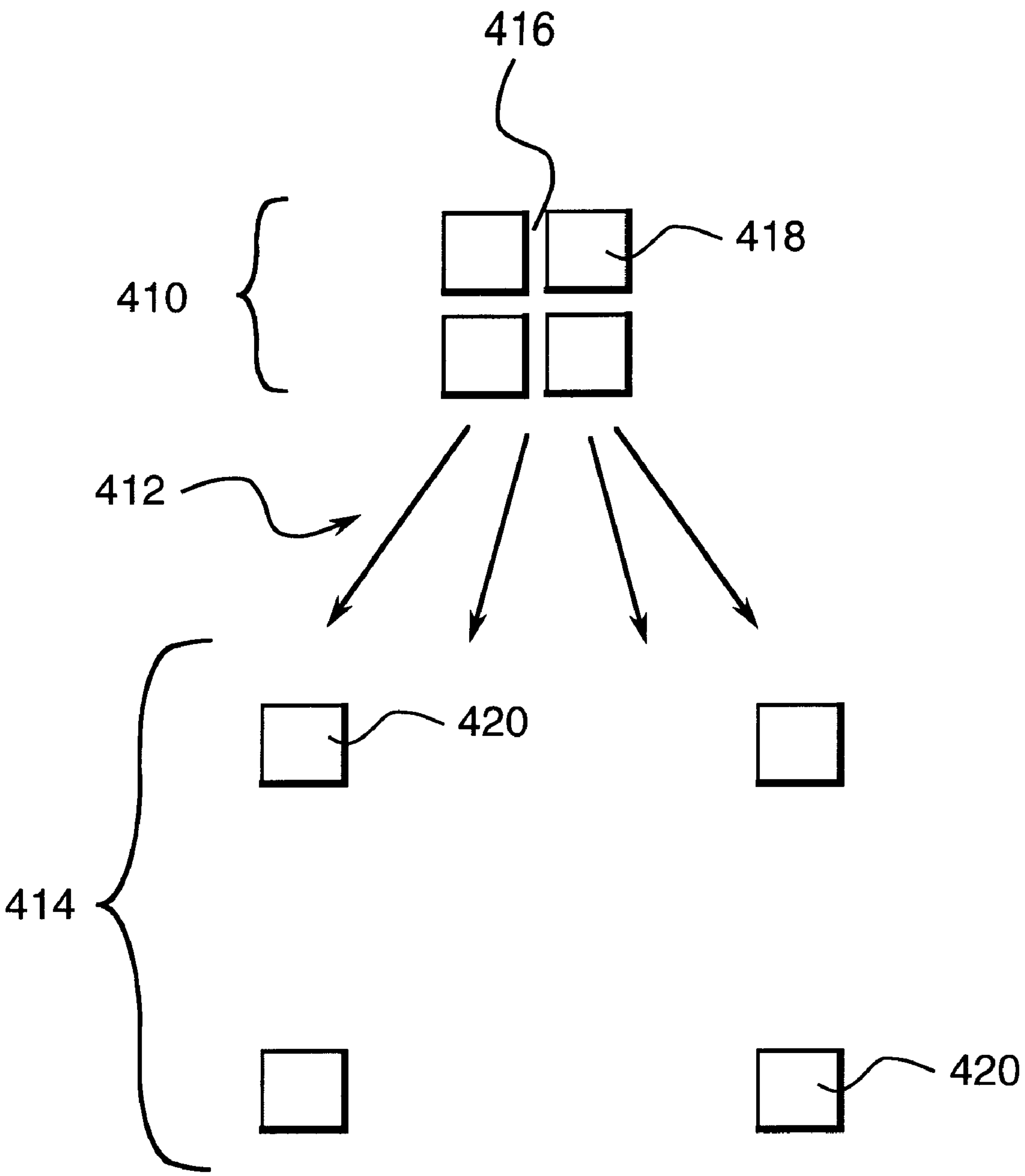
FIG. 6 is a diagram of phase mask patterning.

FIG. 6 is an example perspective diagram of phase mask patterning. As shown, a phase mask pattern 410 has openings 418 separated by mask material 416. The openings are kept close together to reduce the area of material 416 therebetween so that a minimum amount of laser light is wasted. The phase mask, although situating openings 418 close together, does not focus the light 412 such that the ablation areas 420 of ablation pattern 414 are close together.

Optional objective lens 322 of FIG. 5 may comprise, for example, a commercially available AGRIN (Axial Gradient-Index) Lens, a doublet chromatic lens, or a three-plate chromatic lens to reduce the beam power losses and to improve spot size. The lens focuses the images from the phase mask to the desired sizes on the substrate and enables the rays to focus to much smaller spots. This capability provides higher fluence and better resolution.

Table 324 of FIG. 5 preferably comprises a programmable, precision motion table capable of moving the substrate to be machined.

For an example of laser ablation, an excimer laser available from Lambda Physics (model number LPX2101) was operated in an energy stabilized mode and delivered 300 milli joule per pulse. The beam was focused down through a mask including round holes to the point where the energy density reached thirteen joules per square centimeter. The etch rate was 0.73 micrometers per pulse. The entrance ablated hole measured 107 micrometers in diameter. The exit hole measured 100 micrometers. The calculated wall slope s (shown in FIG. 5) was 4.4 milliradians 0.25 degrees). The ablation was performed completely through a 1.5 millimeter thick polyetherimide substrate in 2200 pulses.

The laser can ablate an opening which extends either completely or partially through the substrate. Absorbent material such as that shown as material 117 in FIG. 4 can be added in the substrate openings in any appropriate manner. Aforementioned U.S. Pat. No. 5,557,650 describes for example, a technique of filling channels under vacuum conditions with an absorbing material that can be readily melt-flowed into the channels. If desired other methods such as immersion under pressurized conditions can be used for providing the absorbent materials. Examples of useful absorbent material include a lead-bismuth alloy or lead, bismuth, gold, barium, tungsten, platinum, mercury, thallium, indium, pallatium, antimony, tin, zinc, and alloys thereof.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating an anti-scatter x-ray grid for medical diagnostic radiography, the method comprising:

providing a high laser beam fluence with low beam divergence by combining (a) a phase mask between a substantially transparent substrate and a high power laser and (b) a beam homogenizer for conditioning the laser beam to optimize utilization of beam energy delivered by the laser;

ablating portions of the substrate through the phase mask with the conditioned laser beam;

filling the ablated portions of the substrate with a substantially absorbent material; and removing additional portions of the substrate while permitting selected portions of the substrate to remain.

2. The method of claim 1 wherein the substrate comprises a polymer.

3. The method of claim 1 further including positioning an objective lens between the phase mask and the substrate.

4. The method of claim 1 wherein ablating the portions of the substrate includes forming a complex pattern of ablated portions of the substrate.

5. The method of claim 1 wherein ablating the portions of the substrate includes forming a pattern of ablated portions of the substrate designed to match a pattern of an image detector with which the anti-scatter x-ray grid can be used.

6. The method of claim 1 wherein ablating the portions of the substrate includes forming a pattern of ablated portions of the substrate designed to optimize utilization of the laser beam.

7. The method of claim 1 wherein filling the ablated portions of the substrate with the substantially absorbent material comprises immersing the substrate in the substantially absorbent material under pressurized conditions.

8. The method of claim 1 wherein ablating comprises forming an opening which extends completely through the substrate.

* * * * *